(12) United States Patent
Jacob et al.

(10) Patent No.: US 9,373,721 B2
(45) Date of Patent: Jun. 21, 2016

(54) METHODS OF FORMING A NON-PLANAR ULTRA-THIN BODY SEMICONDUCTOR DEVICE AND THE RESULTING DEVICES

(71) Applicant: GLOBALFOUNDRIES Inc., Grand Cayman (KY)

(72) Inventors: Ajey Poovannummoottil Jacob, Watervliet, NY (US); Ruilong Xie, Niskayuna, NY (US); Michael Hargrove, Clinton Corners, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 149 days.

(21) Appl. No.: 14/175,113

(22) Filed: Feb. 7, 2014

(65) Prior Publication Data
US 2015/0228792 A1    Aug. 13, 2015

(51) Int. Cl.
| | |
|---|---|
| H01L 29/78 | (2006.01) |
| H01L 21/8234 | (2006.01) |
| H01L 21/8238 | (2006.01) |
| H01L 29/66 | (2006.01) |
| H01L 29/51 | (2006.01) |
| H01L 27/088 | (2006.01) |
| H01L 27/12 | (2006.01) |

(Continued)

(52) U.S. Cl.
CPC ...... *H01L 29/785* (2013.01); *H01L 21/823431* (2013.01); *H01L 21/823821* (2013.01); *H01L 27/0886* (2013.01); *H01L 27/1211* (2013.01); *H01L 29/1054* (2013.01); *H01L 29/51* (2013.01); *H01L 29/66795* (2013.01); *H01L 29/6681* (2013.01); *H01L 29/778* (2013.01)

(58) Field of Classification Search
CPC ............ H01L 27/1211; H01L 27/0886; H01L 29/785; H01L 21/845; H01L 21/823821; H01L 21/823431
See application file for complete search history.

(56) References Cited

U.S. PATENT DOCUMENTS 6,458,662 B1 * 10/2002 Yu ...................... H01L 29/66795
                                                                257/E29.298
7,002,214 B1    2/2006  Boyd et al.
(Continued)

OTHER PUBLICATIONS

Boeuf, "Ultra Thin Body and Box-FDSOI (UTBB-FDSOI): from Research to Industrialization (2000-2012)," STMicroelectronics, Jun. 25, 2013.

(Continued)

*Primary Examiner* — Ha Tran T Nguyen
*Assistant Examiner* — Aaron Dehne
(74) *Attorney, Agent, or Firm* — Amerson Law Firm, PLLC

(57) ABSTRACT

One device disclosed includes a gate structure positioned around a perimeter surface of the fin, a layer of channel semiconductor material having an axial length in the channel length direction of the device that corresponds approximately to the overall width of the gate structure being positioned between the gate structure and around the outer perimeter surface of the fin, wherein an inner surface of the layer of channel semiconductor material is spaced apart from and does not contact the outer perimeter surface of the fin. One method disclosed involves, among other things, forming first and second layers of semiconductor material around the fin, forming a gate structure around the second semiconductor material, removing the portions of the first and second layers of semiconductor material positioned laterally outside of sidewall spacers and removing the first layer of semiconductor material positioned below the second layer of semiconductor material.

20 Claims, 12 Drawing Sheets

(51) Int. Cl.
*H01L 29/10* (2006.01)
*H01L 29/778* (2006.01)

(56) References Cited

U.S. PATENT DOCUMENTS

2011/0147839 A1* 6/2011 Yagishita ........ H01L 21/823431
257/347
2011/0263104 A1 10/2011 Adam et al.

OTHER PUBLICATIONS

Hartmann, "Planar FD0-SOI Technology at 28nm and below for extremely power-efficient SoCs," STMicroelectronics, Dec. 2012.
Liu et al., "Ultra-Thin-Body and BOX (UTBB) Fully Depleted (FD) Device Integration for 22nm Node and Beyond," 2010 Symposium on VLSI Technology Digest of Technical Papers, pp. 61-62, 2010.

* cited by examiner

US 9,373,721 B2

METHODS OF FORMING A NON-PLANAR ULTRA-THIN BODY SEMICONDUCTOR DEVICE AND THE RESULTING DEVICES

BACKGROUND OF THE INVENTION

1. Field of the Invention

Generally, the present disclosure relates to the manufacture of FET semiconductor devices, and, more specifically, to various methods of forming a non-planar ultra-thin body semiconductor device and the resulting device structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1 is a perspective view of an illustrative prior art FinFET semiconductor device 10 that is formed above a semiconductor substrate 12 that will be referenced so as to explain, at a very high level, some basic features of a FinFET device 10. In this example, the FinFET device 10 includes three illustrative fins 14, a gate structure 16, sidewall spacers 18 and a gate cap layer 20. The gate structure 16 is typically comprised of a layer of gate insulating material (not separately shown), e.g., a layer of high-k insulating material or silicon dioxide, and one or more conductive material layers (e.g., metal and/or polysilicon) that serve as the gate electrode for the device 10. The fins 14 have a three dimensional configuration: a height 14H, a width 14W and a long-axis or axial length 14L. The axial length 14L corresponds to the direction of current travel in the device 10 when it is operational. The dashed line 14C depicts the long-axis or centerline of the fins 14. The portions of the fins 14 covered by the gate structure 16 are the channel regions of the FinFET device 10. In a conventional process flow, the portions of the fins 14 that are positioned outside of the spacers 18, i.e., in the source/drain regions of the device 10, may be increased in size or even merged together (a situation not shown in FIG. 1) by performing one or more epitaxial growth processes. The process of increasing the size of or merging the fins 14 in the source/drain regions of the device 10 is performed to reduce the resistance of source/drain regions and/or make it easier to establish electrical contact to the source drain regions. Even if an epi "merge" process is not performed, an epi growth process will typically be performed on the fins 14 to increase their physical size.

In the FinFET device 10, the gate structure 16 may enclose both sides and the upper surface of all or a portion of the fins 14 to form a tri-gate structure so as to use a channel having a three-dimensional structure instead of a planar structure. In some cases, an insulating cap layer (not shown), e.g., silicon nitride, is positioned at the top of the fins 14 and the FinFET device 10 only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins 14, i.e., the vertically oriented sidewalls and the top upper surface of the fin, form a surface inversion layer or a volume inversion layer that contributes to current conduction. In a FinFET device, the "channel-width" is estimated to be about two times ($2\times$) the vertical fin-height of the fin 14 plus the width of the top surface of the fin 14, i.e., the fin width. Multiple fins can be formed in the same foot-print as that of a planar transistor device. Accordingly, for a given plot space (or foot-print), FinFET devices tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures 16 for such FinFET devices 10 may be manufactured using so-called "gate-first" or "replacement gate" (gate-last) manufacturing techniques.

The above-described FET and FinFET devices may be formed in bulk semiconductor substrates (e.g., silicon) or they may be formed using semiconductor-on-insulator (SOI) technology, wherein the devices are formed in a single crystal semiconductor material on top of an insulating layer. The insulating layer is typically a so-called buried oxide layer (BOX), which, in turn, is positioned above a silicon wafer. Advances in integrated circuit manufacturing is typically associated with decreasing feature sizes, namely the decrease in the gate length of the devices. The focus today is on the fabrication of FET devices with gate lengths of 25 nm, and less. The main candidates for reaching such short gate lengths are SOI devices, either planar devices or non-planar devices. It is known from device scaling theory that, for proper functioning, the device body above the channel region has to be scaled down in proportion to the gate length of the device. It is expected that, for planar SOI devices, the body thickness may have to be about ⅓ to ¼ of the gate length of the device. While, for non-planar FET devices, such as FinFet devices, the body thickness may have to be about ½ to ⅓ of the gate length. In general, the thinner the device body above the channel, the better the electrostatic control characteristics of the device, which results in reduced leakage currents. While the above statements reflect desirable aspects of such thin body devices in terms of electrical performance, manufacturing such devices is very difficult and presents many challenges. The ultimate for device designers is to manufacture such thin body devices using techniques that are reliable and suitable for large scale production.

The present disclosure is directed to various methods of forming a non-planar ultra-thin body semiconductor device and the resulting device structures that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a non-planar ultra-thin body semiconductor device and the resulting device structures. One illustrative device disclosed herein includes, among other things, a fin defined in a semiconductor substrate, a gate structure positioned around a perimeter surface of the fin, the gate structure comprising a gate insulation layer, a gate electrode and at least one outermost sidewall spacer, the gate structure having an overall width in a channel length direction of the device that is defined by outer edges of the at least one outermost spacer and a layer of channel semiconductor material positioned between the gate structure and around the outer perimeter surface of the fin, the layer of channel semiconductor material having an axial length in the channel length direction of the device that corresponds approximately to the overall width of the gate structure, wherein an inner surface of the layer of channel semiconductor material is spaced apart from and does not contact the outer perimeter surface of the fin.

One illustrative method disclosed herein involves, among other things, forming a fin in a semiconductor substrate, forming a first layer of semiconductor material on an outer perimeter surface of the fin, forming a second layer of semiconductor material on the first layer of semiconductor material, forming a gate structure comprised of a gate insulation layer, a conductive gate electrode and at least one outermost sidewall spacer around the second semiconductor material, wherein the gate structure has an overall width in a channel length direction of the device that is defined by outer edges of the at least one outermost spacer, performing at least one etching process to remove the portions of the first and second layers of semiconductor material positioned laterally outside of the at least one sidewall spacer and performing at least one additional etching process to remove the first layer of semiconductor material that is positioned below the second layer of semiconductor material so as to thereby define an empty cavity positioned between an inner surface of the second layer of semiconductor material and an outer perimeter surface of the fin, wherein the empty cavity has an axial length in the channel length direction of the device that corresponds approximately to the overall width of the gate structure.

BRIEF DESCRIPTION OF THE DRAWINGS

The disclosure may be understood by reference to the following description taken in conjunction with the accompanying drawings, in which like reference numerals identify like elements, and in which.

Figure 1:
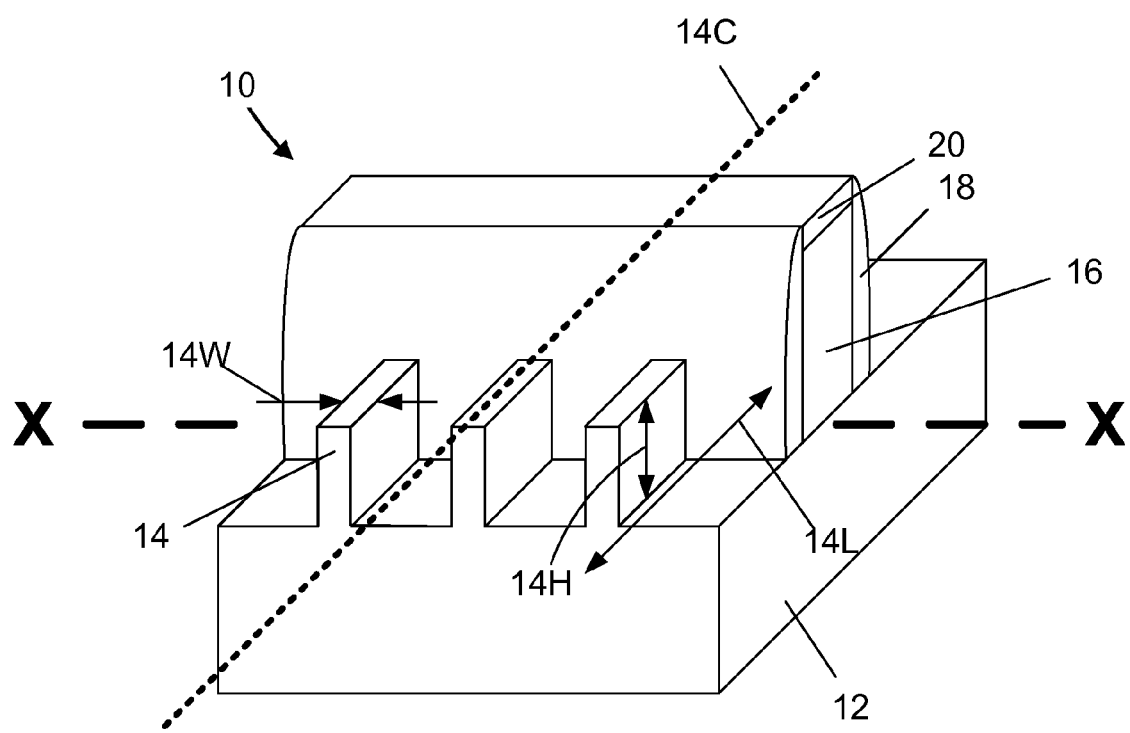
FIG. 1 depicts an illustrative example of a prior art FinFET device with various features identified for reference purposes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a non-planar ultra-thin body semiconductor device and the resulting device structures. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 2A:
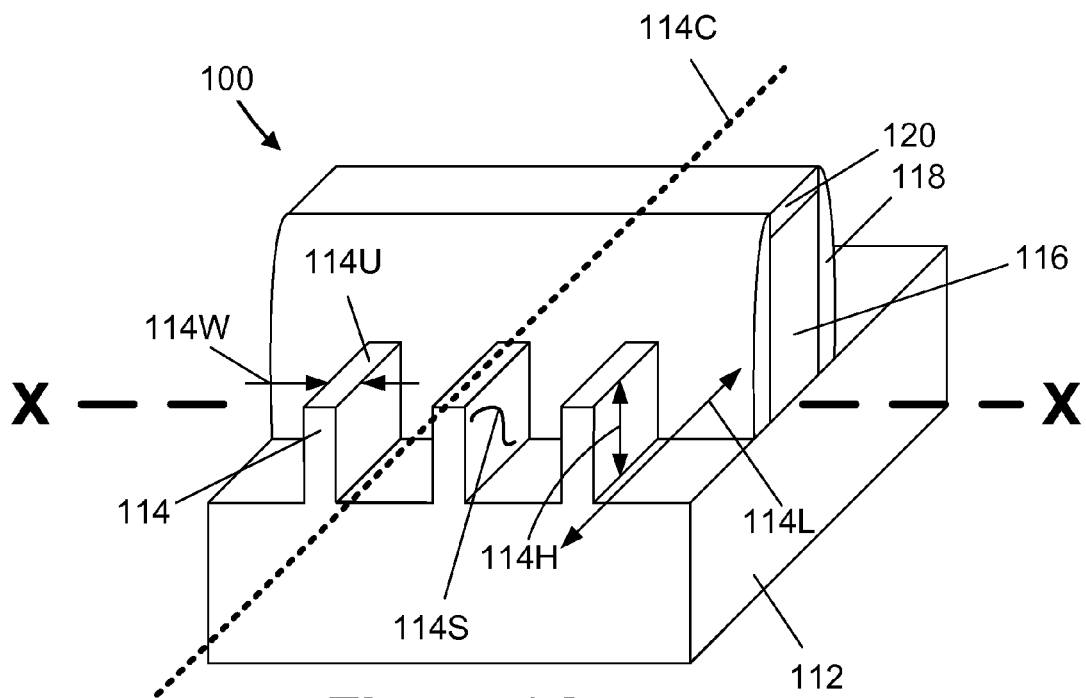
FIGS. 2A-2D depict illustrative examples of how the non-planar ultra-thin body semiconductor devices disclosed herein may be, but are not required to be, oriented on semiconductor substrates.

FIG. 2A is a perspective view of an illustrative thin body semiconductor device 100 that may be formed in accordance with the methods disclosed herein. The device 100 is formed above a semiconductor substrate 112. The illustrative substrate 112 may be a bulk semiconductor substrate, or it may be the active layer of a so-called SOI (silicon-on-insulator) substrate or a so-called SGOI (silicon/germanium on insulator) substrate. Thus, the terms "substrate," "semiconductor substrate" or "semiconducting substrate" should be understood to cover all semiconductor materials and all forms of such semiconductor materials. The device 100 may be either a P-type device or an N-type device.

With continuing reference to FIG. 2A, in this example, the device 100 includes three illustrative fins 114, a gate structure 116, outermost sidewall spacers 118 and a gate cap layer 120. The gate structure 116 is typically comprised of a layer of gate insulating material (not separately shown in FIG. 2A), e.g., a layer of high-k insulating material or silicon dioxide, and one or more conductive material layers (e.g., metal and/or polysilicon) that serve as the gate electrode for the device 100. The gate structure 116 may be formed using either "replacement gate" or "gate-first" manufacturing techniques. Of course, as will be appreciated by those skilled in the art after a complete reading of the present application, the device disclosed herein may be formed with any desired number of fins 114.

The fins 114 have a three dimensional configuration: a height 114H, a width 114W and a long-axis or axial length 114L. The axial length 114L corresponds to the direction of current travel in the device 100 when it is operational. The dashed line 114C depicts the long-axis or centerline of the fins 114. The gate structure 116 is positioned above the channel regions of the device 100. In a conventional process flow, the portions of the fins 114 that are positioned outside of the outermost spacers 118, i.e., in the source/drain regions of the device 100, may be increased in size or even merged together (may be merged or unmerged epi) by performing one or more epitaxial growth processes. The process of increasing the size of or merging the fins 114 in the source/drain regions of the device 100 is typically performed to, among other things, reduce the resistance of source/drain regions and/or make it easier to establish electrical contact to the source drain regions. In many cases, the fins 114 may be undoped or have a low dopant concentration, which tends to result in poor or less than desirable electrical contact. Even if an epi "merger" process is not performed, an epi growth process will typically be performed on the fins 114 to increase their physical size. View "X-X" in FIG. 2A depicts the locations where various cross-sectional views of the devices disclosed herein may be taken in the drawings discussed below, i.e., through what will become a source/drain region for the device 100 in a direction perpendicular to the long axis 114L of the fins 114 (or stated another way, in a direction that is parallel to the gate width direction of the device 100).

In some cases discussed herein, reference will be made to orienting the sidewalls and/or long axis 114L of the fins 114 of the device 100 in a certain crystallographic orientation. The methods disclosed herein involve formation of an epi semiconductor material on the fins 114, as described more fully below. Formation of such epi semiconductor material on the fins 114 that are formed on substrates 112 oriented as described herein is easier to control. Additionally, uniform epi growth yields more uniform dopant incorporation because the concentration of dopant material of even the amount (%) of germanium may depend upon the crystalline orientation of the fins.

Figure 2B:
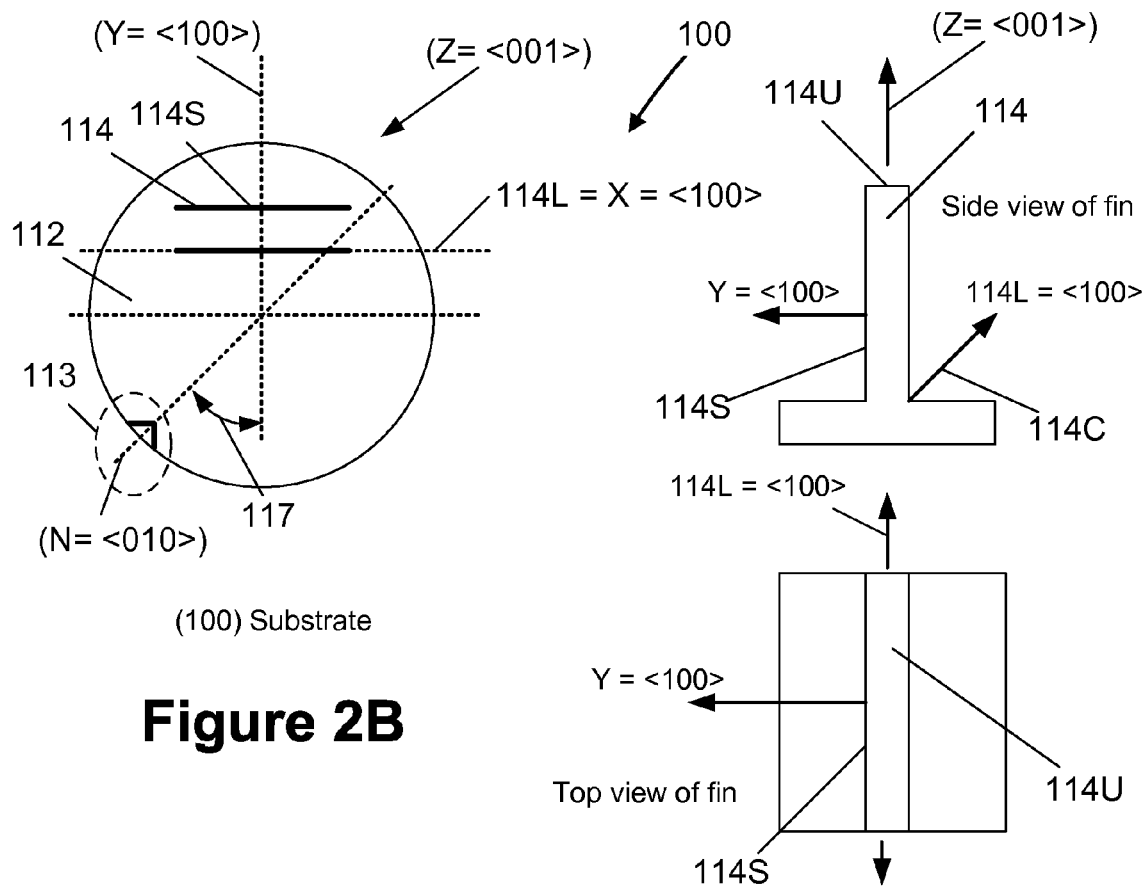

FIG. 2B depicts one illustrative example disclosed herein of how the fins 114 of the device 100 may be oriented relative to the crystallographic orientation of the substrate material. However, as will be appreciated by those skilled in the art after a complete reading of the present application, the inventions disclosed herein are not limited to use with any particular type of substrate with any particular crystalline structure or to the orientation of the fins 114 on such a substrate relative to the crystallographic orientation of the substrate material. FIG. 2B depicts an illustrative substrate 112 having a (100) crystalline structure, wherein the use of "( )" denotes a specific plane. Such (100) substrates are well known in the art and are generally commercially available from a number of manufacturers. As is well known to those skilled in the art, the (100) substrate 112 is manufactured in such a manner that the crystalline planes within the substrate 112 are arranged in a certain ordered arrangement. As used herein, the "< >" designation reflects an identification of a family of equivalent directions. The plan view in FIG. 2B reflects one illustrative embodiment disclosed herein for orienting the illustrative fins 114 of the device 100 relative to various crystallographic structures of the (100) substrate 112. As is customary, the (100) substrate 112 includes a notch 113 that is aligned with the <010> crystallographic plane, i.e., the notched plane "N" of the substrate 112. In this embodiment, the (100) substrate 112 is rotated 45 degrees relative to the vertical, as indicated by the angle 117, and the fins 114 are manufactured such that the long axis 114L of the fins 114 is oriented at 45 degrees relative to the notched plane "N" of the (100) substrate 112. For example, FIG. 2B depicts a plan view of such an illustrative (100) substrate 112 with a surface normal "Z" in the (100) crystalline plane. As thus oriented, the sidewalls 114S of the fins 114 are oriented in the <100> crystallographic direction in the "Y" or vertical direction (in the plan view) and the long axis 114L of the fins 114 are oriented in the <100> crystallographic direction in the "X" or horizontal direction (in the plan view). The upper surface 114U of the fins 114 are oriented in the <001> crystallographic direction in the "Z" direction i.e., in the direction into and out of the plan view drawing in FIG. 2B. Also depicted in FIG. 2B is a cross-sectional view and a top view of an illustrative fin structure 114 showing the crystalline orientation of various aspects of the fin 114 that is formed in the (100) substrate 112 with the notch 113 rotated 45 degrees relative to the vertical. As can be seen in these views, the long axis 114L of the fin 114 is positioned in the <100> crystallographic direction of the crystalline structure of the substrate 112, while the sidewalls 114S of the fins 114 are also positioned in the <100> direction of the crystalline structure of the rotated (100) substrate 112.

Figure 2C:
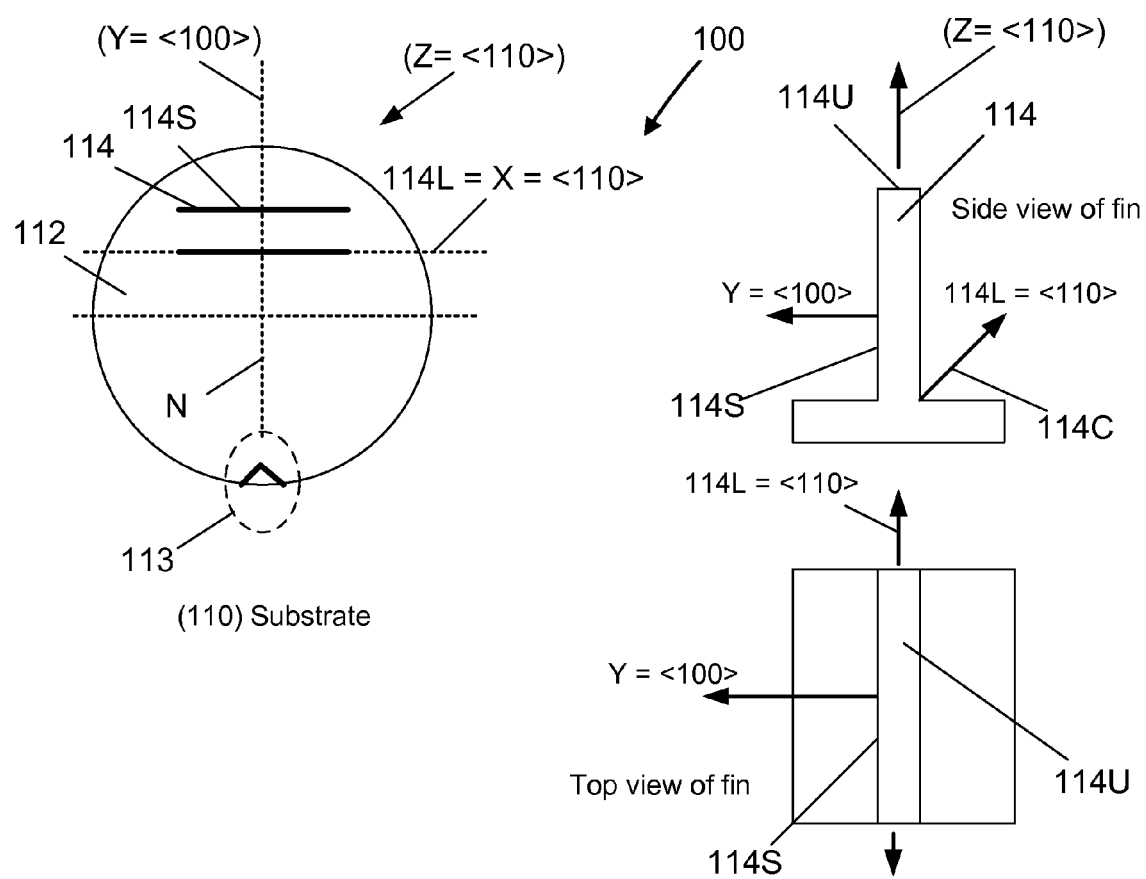

FIG. 2C depicts another illustrative example disclosed herein of how the fins 114 of the device 100 may be oriented relative to the crystallographic orientation of the substrate 112. FIG. 2C depicts an illustrative substrate 112 having a (110) crystalline structure, wherein the use of "( )" denotes a specific plane. Such (110) substrates are well known in the art and are generally commercially available from a number of manufacturers. The plan view in FIG. 2C reflects one illustrative embodiment disclosed herein for orienting the illustrative fins 114 of the device 100 relative to various crystallographic structures of the (110) substrate 112. As is customary, the (110) substrate 112 includes a notch 113 that is aligned with the <100> crystallographic plane, i.e., the notched plane "N" of the substrate 112. In this embodiment, the (110) substrate 112 is not rotated relative to the vertical, and the fins 114 are manufactured such that the long axis 114L of the fins 114 is oriented perpendicular relative to the notched plane "N" of the (110) substrate 112. For example, FIG. 2C depicts a plan view of such an illustrative (110) substrate 112 with a surface normal "Z" in the (110) crystalline plane. As thus oriented, the sidewalls 114S of the fins 114 are oriented in the <100> crystallographic direction in the "Y" or vertical direction (in the plan view) and the long axis 114L of the fins 114 are oriented in the <110> crystallographic direction in the "X" or horizontal direction (in the plan view). The upper surface 114U of the fins 114 are oriented in the <110> crystallographic direction in the "Z" direction, i.e., in the direction into and out of the plan view drawing in FIG. 2C. Also depicted in FIG. 2C is a cross-sectional view and a top view of an illustrative substrate fin structure 114 showing the crystalline orientation of various aspects of the fin 114 that is formed in the non-rotated (110) substrate 112. As can be seen in these views, the long axis 114L of the fin 114 is positioned in the <110> crystallographic direction of the crystalline structure of the substrate 112, while the sidewalls 114S of the fins 114 are positioned in the <100> direction of the crystalline structure of the non-rotated (110) substrate 112.

Figure 2D:
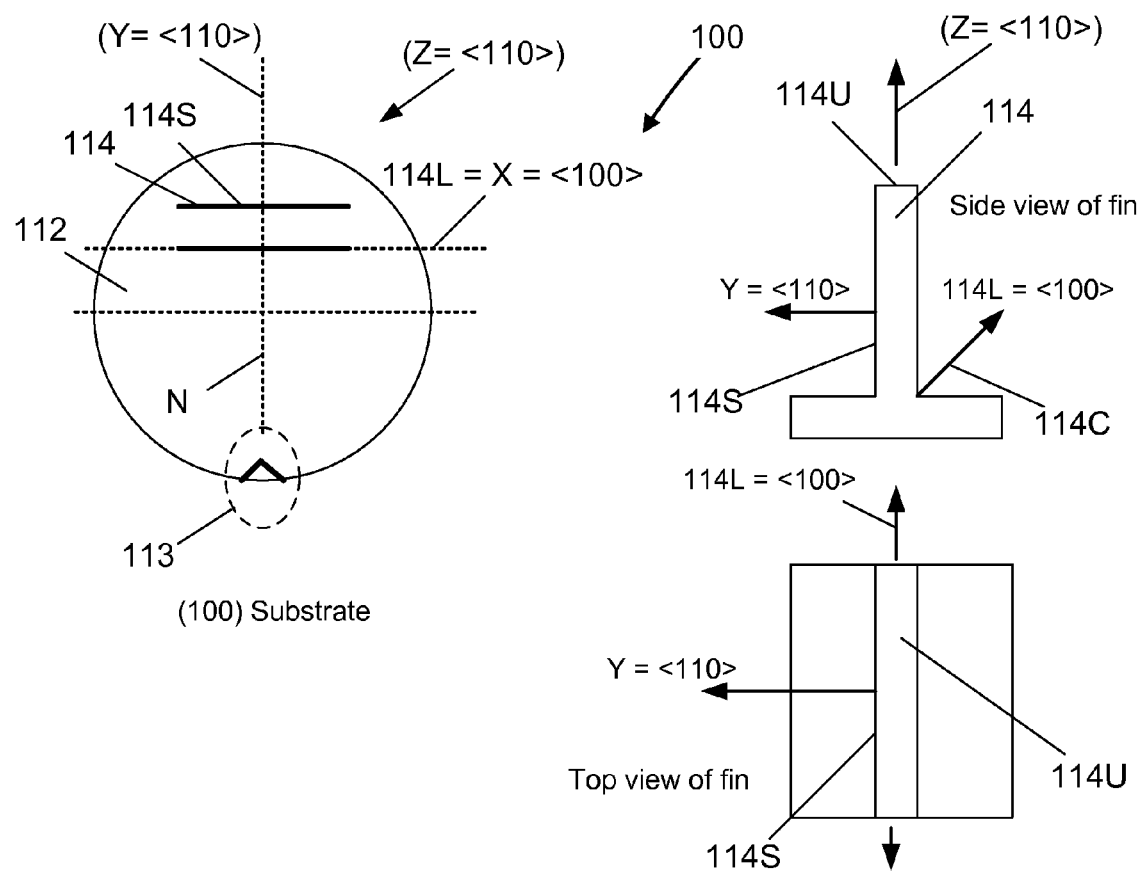

FIG. 2D depicts yet another illustrative example disclosed herein of how the fins 114 of the device 100 may be oriented relative to the crystallographic orientation of the substrate material. FIG. 2D depicts an illustrative substrate 112 having a (100) crystalline structure, wherein the use of "( )" denotes a specific plane. The plan view in FIG. 2D reflects one illustrative embodiment disclosed herein for orienting the illustrative fins 114 of the device 100 relative to various crystallographic structures of the (100) substrate 112. As is customary, the (100) substrate 112 includes a notch 113 that is aligned with the <010> crystallographic plane, i.e., the notched plane "N" of the substrate 112. In this embodiment, the (100) substrate 112 is not rotated relative to the vertical (i.e., zero degrees of rotation), and the fins 114 are manufactured such that the long axis 114L of the fins 114 is oriented transverse or normal relative to the notched plane "N" of the (100) substrate 112. For example, FIG. 2D depicts a plan view of such an illustrative (100) substrate 112 with a surface normal "Z" in the (100) crystalline plane. As thus oriented, the sidewalls 114S of the fins 114 are oriented in the <110> crystallographic direction in the "Y" or vertical direction (in the plan view) and the long axis 114L of the fins 114 are oriented in the <100> crystallographic direction in the "X" or horizontal direction (in the plan view). The upper surface 114U of the fins 114 are oriented in the <001> crystallographic direction in the "Z" direction i.e., in the direction into and out of the plan view drawing in FIG. 2D. Also depicted in FIG. 2D is a cross-sectional view and a top view of an illustrative fin structure 114 showing the crystalline orientation of various aspects of the fin 114 that is formed in the non-rotated (100) substrate 112. As can be seen in these views, the long axis 114L of the fin 114 is positioned in the <100> crystallographic direction of the crystalline structure of the substrate 112, while the sidewalls 114S of the fins 114 are positioned in the <110> direction of the crystalline structure of the non-rotated (100) substrate 112.

One illustrative process flow that may be employed to form the device 100 on either the rotated (100) substrate 112, the non-rotated (100) substrate or the non-rotated (110) substrate 112 will now be described with reference to FIGS. 3A-3P. In addition, the methods disclosed herein may be employed to form the disclosed devices on other types of substrates that may be oriented in a manner different than those orientations discussed above. Of course, other process flows may be used to form the fins 114 of the device 100 disclosed herein. Thus, the methods and devices disclosed herein should not be considered to be limited to the illustrative process flow described herein nor to the illustrative substrates/orientations discussed above.

Figure 3A:
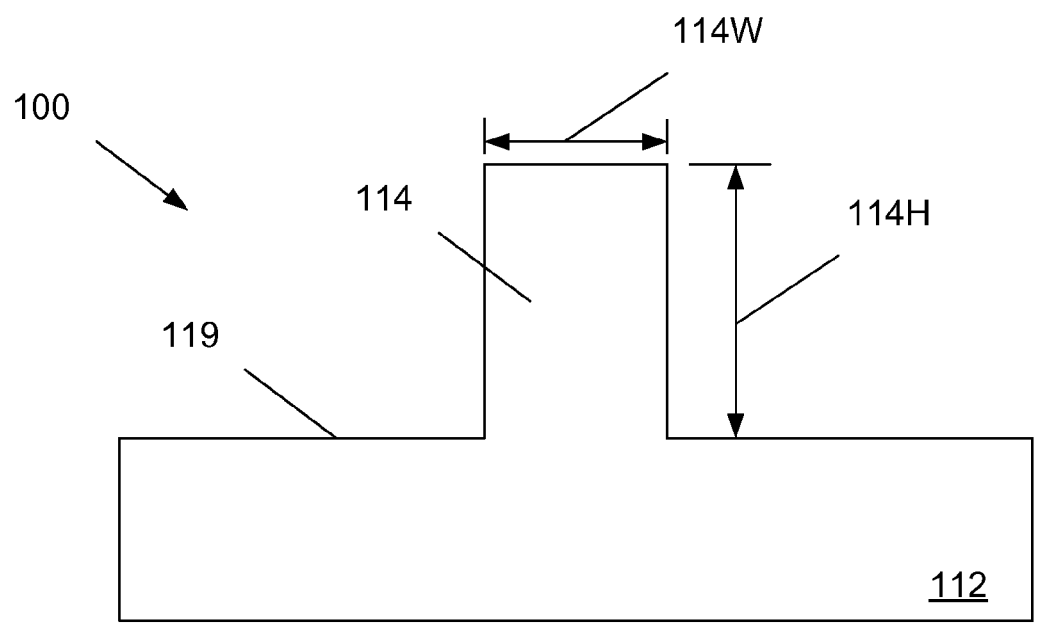
FIG. 3A-3P depict various illustrative methods of forming the illustrative non-planar ultra-thin body semiconductor devices and the resulting device structures.

At the point of fabrication depicted in FIG. 3A, one or more etching processes were performed on the substrate 112 through a patterned etch mask (not shown) to define a plurality of trenches 119 in the substrate 112. The formation of the trenches 119 results in the formation of an illustrative fin 114. Of course, as noted above, the device 100 may be formed with any desired number of fins114. The height 114H and width 114W of the fins 114 may vary depending upon the particular application.

Figure 3B:
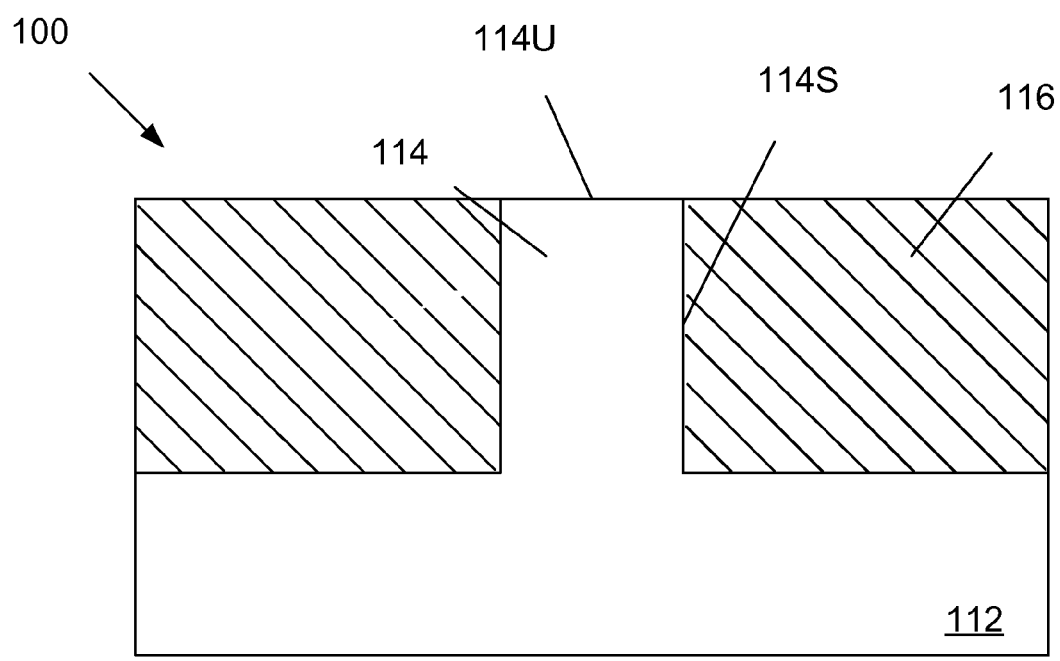

Thereafter, as shown in FIG. 3B, the trenches 119 were overfilled with an insulating material 116 and a planarization process, e.g., a CMP process or an etch-back process, was performed to planarize the upper surface of the layer of insulating material 116 with the upper surface 114U of the fin 114. In some cases, a patterned hard mask layer (not shown) may be positioned above the upper surface 114U of the fin 114. In such situations, the upper surface of the layer of insulating material 116 would be planarized with the upper surface of such a patterned hard mask layer. As noted above, in the case of the 45 degree rotated (100) substrate 112 embodiment, the long axis 114L of the fins 114 will be oriented in the <100> direction of the rotated (100) substrate 112. In the case of the non-rotated (110) substrate embodiment, the long axis 114L of the fins 114 will be oriented in the <110> direction of the non-rotated (110) substrate. Additionally, in the cross-sectional views shown herein, the sidewalls 114S of the fin 114 are substantially positioned in the <100> crystallographic direction of the substrate 112 for either the 45 degree rotated (100) substrate or the non-rotated (110) substrate. The layer of insulating material 116 discussed herein may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., chemical vapor deposition (CVD), etc.

The depth and width of the trenches 119 as well as the height and width of the fins 114 may vary depending upon the particular application. In one illustrative embodiment, based on current day technology, the width of the trenches 119 may range from about 10 nm to several micrometers. In some embodiments, the fins 114 may have a width within the range of about 5-30 nm. In the illustrative examples depicted in the attached figures, the trenches 119 and the fins 114 are all of a uniform size and shape. However, such uniformity in the size and shape of the trenches 119 and the fins 114 may not be required to practice at least some aspects of the inventions disclosed herein. In the example disclosed herein, the trenches 119 are depicted as having been formed by performing an anisotropic etching process that results in the trenches 119 having a schematically depicted, generally rectangular configuration with substantially vertical sidewalls. In an actual real-world device, the sidewalls of the trenches 119 may be somewhat inwardly tapered, although that configuration is not depicted in the attached drawings. In some cases, the trenches 119 may have a reentrant profile near the bottom of the trenches 119. To the extent the trenches 119 are formed by performing a wet etching process, the trenches 119 may tend to have a more rounded configuration or non-linear configuration as compared to the generally rectangular configuration of the trenches 119 that are formed by performing an anisotropic etching process. Thus, the size and configuration of the trenches 119, and the manner in which they are made, should not be considered a limitation of the present invention. For ease of disclosure, only the substantially rectangular trenches 119 and fins 114 will be depicted in subsequent drawings. In the case of fins 114 having a tapered cross-sectional configuration (not shown), the sidewalls 114S of such tapered fins may be positioned slightly out of the <100> direction noted above due to the tapered shape of the fins 114. Of course, if desired, the fins 114 may be manufactured to have more vertically oriented sidewalls or even substantially vertical sidewalls, as depicted in the attached drawings. The more vertical the sidewalls 114S of the fins 114, the more closely the sidewalls 114S will be positioned in the <100> direction of the substrate 112. Thus, when it is stated herein and in the attached claims that the long-axis 114L or centerline of the fins 114 disclosed herein are positioned in the <100> direction of the substrate 112, it is intended to cover fins 114 so oriented irrespective of their cross-sectional configuration, i.e., irrespective of whether the fins 114 are tapered or rectangular or any other shape when viewed in cross-section.

Figure 3C:
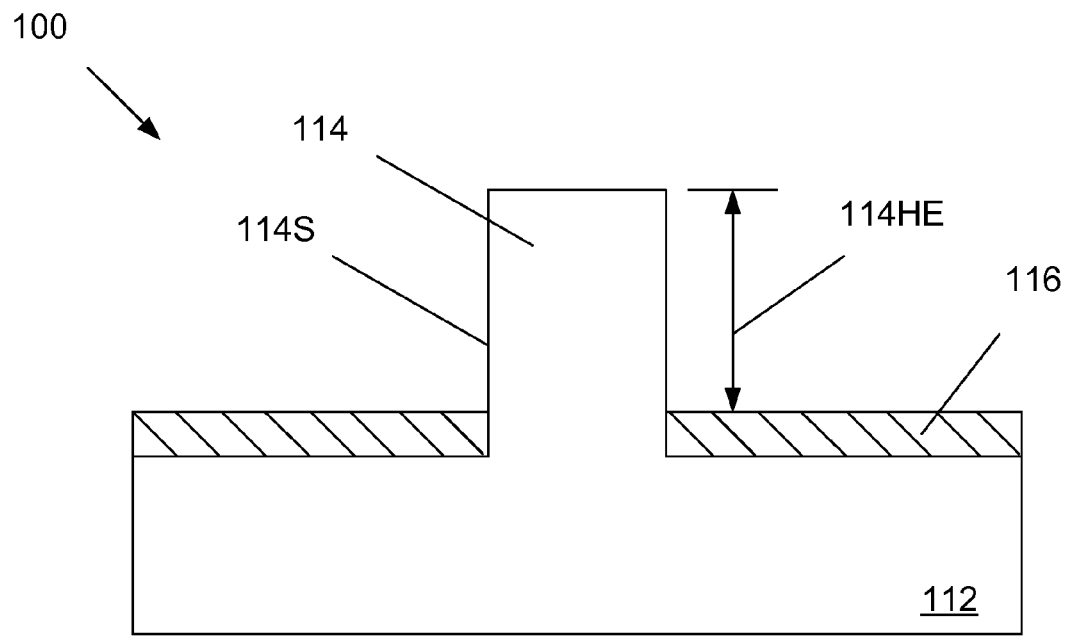

Next, as shown in FIG. 3C, a recess etching process was performed to reduce the thickness of the layer of insulating material 116 and to set the exposed height 114HE of the fin 114 at this point in the process flow. The amount of the layer of insulating material 116 that remains after the recessing ("etch-back") process is performed may vary depending upon the particular application, e.g., 5-10 nm.

Figure 3D:
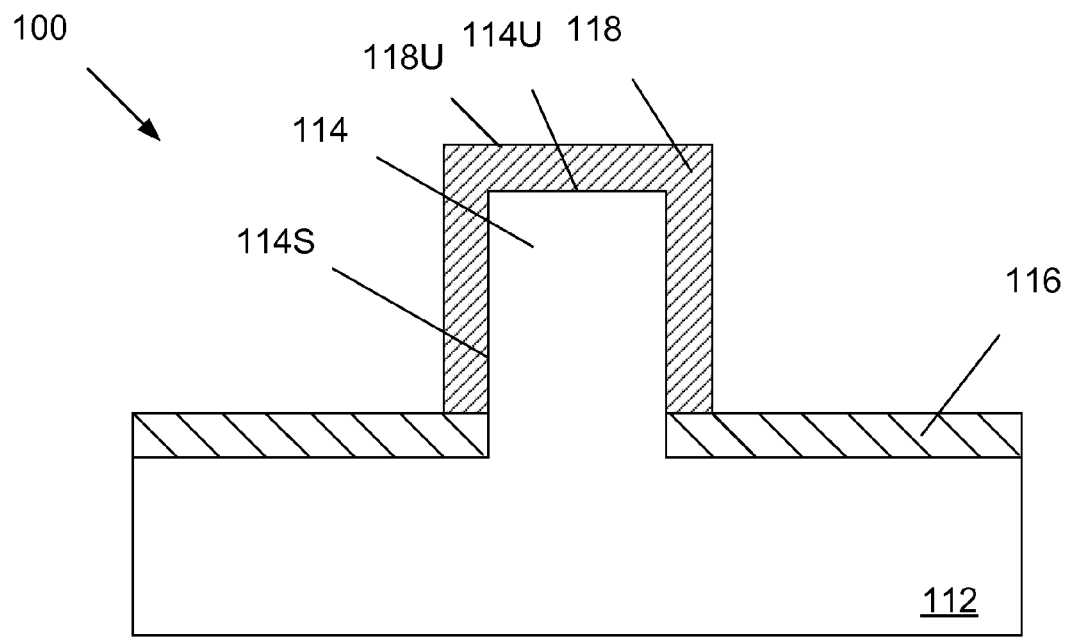

FIG. 3D depicts the device 100 after an epitaxially deposited/grown semiconductor material 118 was formed on the exposed portion of the fin 114, which has a conformal cladding or box-like configuration. Note that, in this embodiment, the epi semiconductor material 118 has a substantially uniform thickness (+/−10%) on the sidewalls 114S and the upper surface 118U of the epi semiconductor material 118 (the portion positioned above the upper surface 114U of the fin 114) is substantially planar. The thickness of the epi material 118 in the corner regions may experience somewhat more thickness variation, and it may be, on average, slightly thicker in the corner regions than on the sidewalls or above the upper surface of the fin 114. In some embodiments, the thickness of the portion of the epi semiconductor material 118 positioned above the upper surface 114U of the fin 114 may be slightly less than the thickness of the epi semiconductor material 118 positioned adjacent the sidewalls of the fin 114. In one example, the epi semiconductor material 118 may be formed to any desired thickness, e.g., a thickness of less than 10 nm. The epi semiconductor material 118 may be performed by performing a traditional epitaxial deposition/growth process. The epi semiconductor material 118 may be comprised of a variety of different materials, e.g., silicon, silicon/germanium, germanium, silicon phosphorous (SiP), silicon carbon phosphorous (SiCP), germanium tin (GeSn), Si:B, SiGe:B, SiGe:P, SiGe:As, etc. As will be described more fully below, the epi semiconductor material 118 should be made of a material that may be selectively etched relative to the substrate 112 material and the layer of insulating material 116.

Figure 3E:
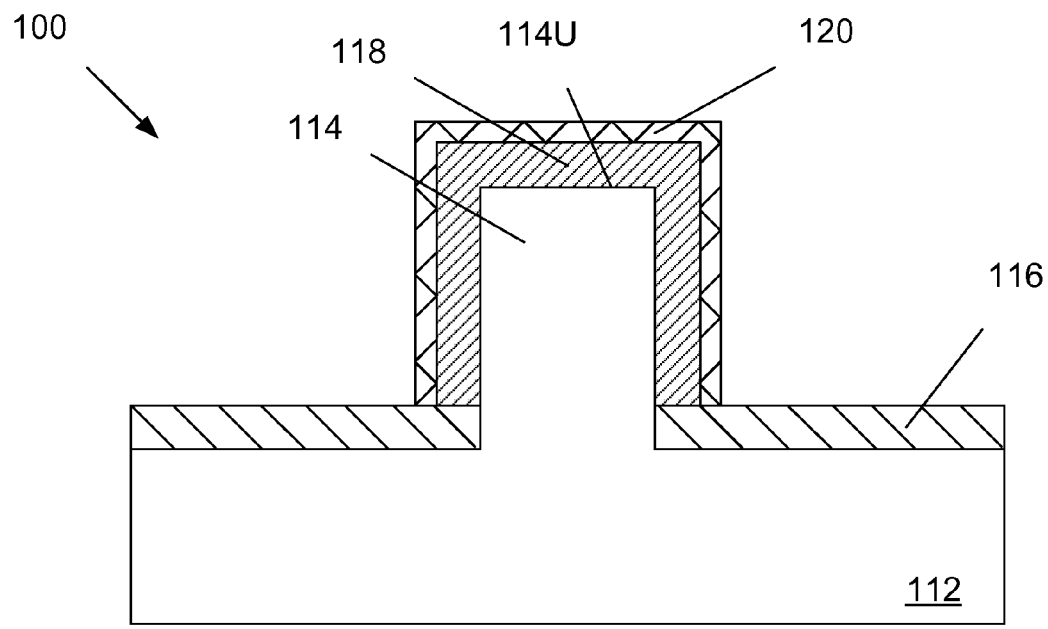

FIG. 3E depicts the device 100 after another epitaxially deposited/grown semiconductor material 120 was formed on the epi material 118. Note that, in this embodiment, the epi material 120 has a substantially uniform thickness as well. However, as before, the thickness of the epi material 120 in the corner regions may experience somewhat more thickness variation, and it may be, on average, slightly thicker in the corner regions than on the sidewalls or above the upper surface of the fin 114. In some embodiments, the thickness of the portion of the epi semiconductor material 120 positioned above the upper surface 114U of the fin 114 may be slightly less than the thickness of the epi semiconductor material 120 positioned adjacent the sidewalls of the fin 114. In one example, the epi semiconductor material 120 may be formed to any desired thickness, e.g., a thickness of less than 10 nm, such as 3-6 nm. The epi semiconductor material 120 may be formed by performing a traditional epitaxial deposition/growth process. The epi semiconductor material 120 may be comprised of a variety of different materials, e.g., silicon, silicon/germanium, germanium, silicon phosphorous (SiP), silicon carbon phosphorous (SiCP), germanium tin (GeSn), Si:B, SiGe:B, SiGe:P, SiGe:As, etc. As will be described more fully below, the epi semiconductor material 118 should be made of a material that may be selectively etched relative to the substrate 112 material, the layer of insulating material 116 and the epi material 120. In one particularly illustrative embodiment, the fin 114 and the epi semiconductor material 120 may be made of silicon, while the epi semiconductor material 118 may be made of silicon/germanium.

Figure 3F:
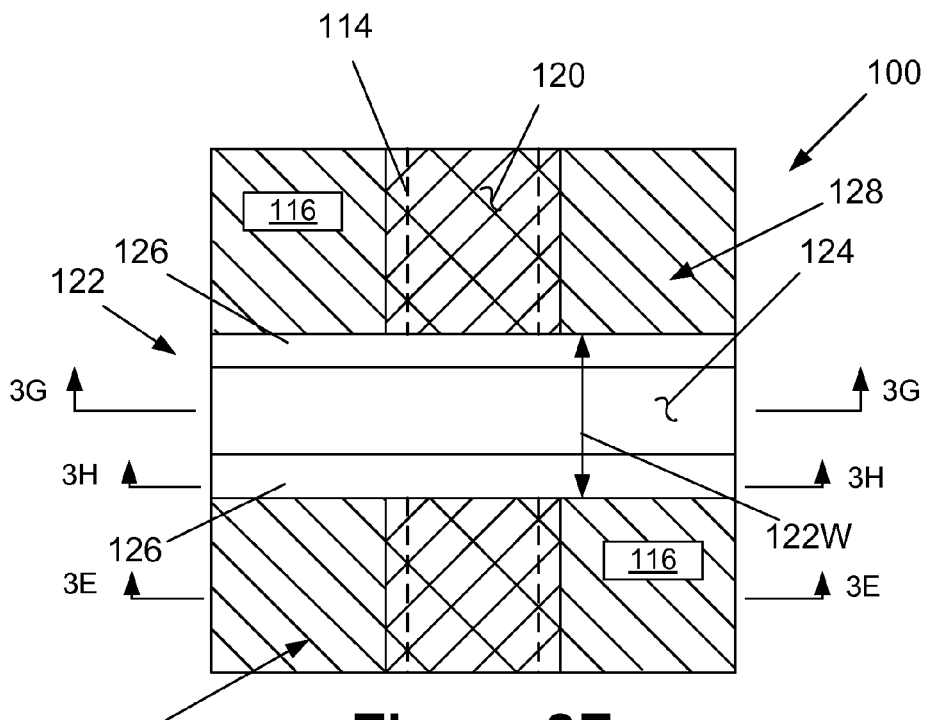

FIG. 3F is a plan view after an illustrative gate structure 122, a gate cap layer 124 and sidewall spacers 126 were formed on the device 100 above the fin 114 shown in FIG. 3E. The location where various cross-sectional views are taken in subsequent drawings is also depicted in FIG. 3F. Cross-hatching has been maintained in FIG. 3F in an effort to provide clarity. The fin 114 is depicted in dashed lines in FIG. 3F. The gate structure 122 is intended to be representative in nature of any gate structure that may be formed on semiconductor devices. The illustrative gate structure 122 may be formed using well-known techniques. i.e., gate-first or replacement gate techniques. Of course, the materials of construction used for the gate structure 122 on a P-type device may be different than the materials used for the gate structure 122 on the N-type device.

Figure 3G:
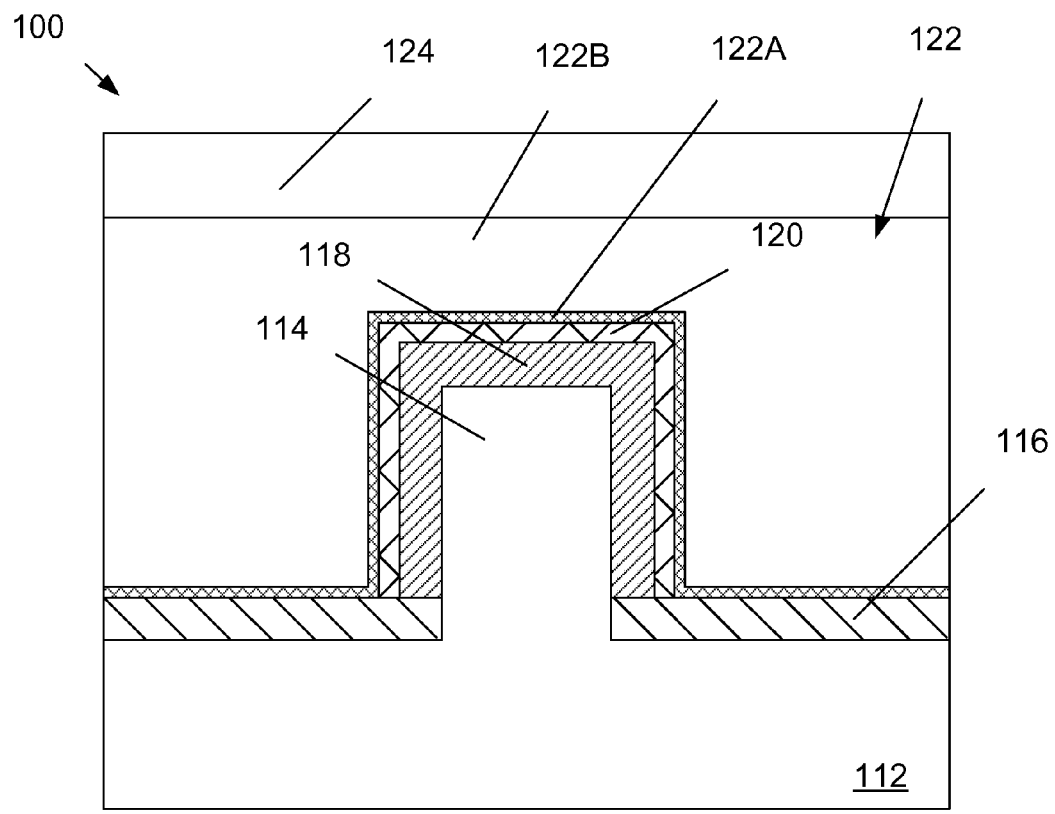
Figure 3H:
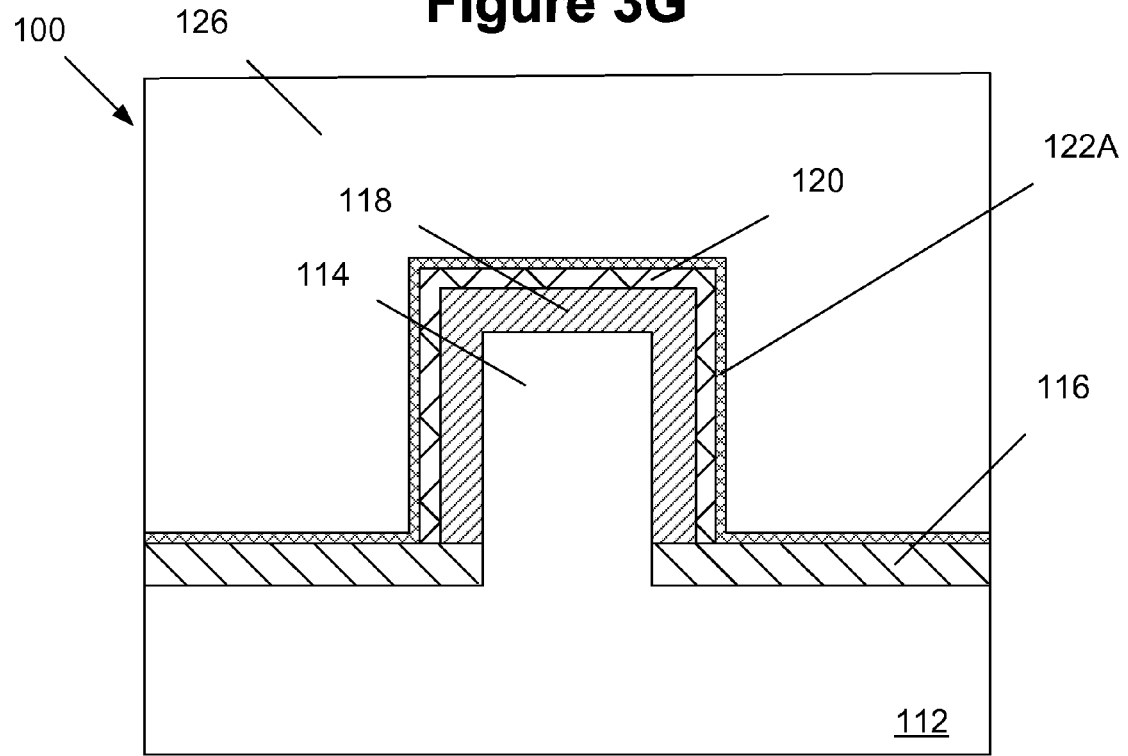

FIG. 3G is a cross-sectional view taken through the channel region of the device in a direction that is transverse to the long axis of the fin 114 (i.e., in the gate-width direction of the device 100). FIG. 3H is a cross-sectional view taken through the spacer 126 in a direction that is parallel to the gate-width direction of the device 100. With reference to FIGS. 3G-3H, in one illustrative embodiment, the schematically depicted gate structure 122 includes an illustrative gate insulation layer 122A and an illustrative gate electrode 122B. The gate insulation layer 122A may be comprised of a variety of different materials, such as, for example, silicon dioxide, a so-called high-k (k greater than 7) insulation material (where k is the relative dielectric constant), etc. The thickness of the gate insulation layer 122A may also vary depending upon the particular application, e.g., it may have a physical thickness of about 1-2 nm. Similarly, the gate electrode 122B may also be of a variety of conductive materials, such as polysilicon or amorphous silicon, or it may be comprised of one or more metal layers that act as the gate electrode. As will be recognized by those skilled in the art after a complete reading of the present application, the gate structure 122 depicted in the attached drawings, i.e., the gate insulation layer and the gate electrode, are intended to be representative in nature. That is, the gate structure 122 may be comprised of a variety of different materials and they may have a variety of configurations. In one illustrative embodiment, a deposition process may be performed to form a gate insulation layer comprised of a high-k layer of insulating material, $HfO_2$, $Al_2O_3$, etc. Thereafter, the gate electrode material and the gate cap layer material may be deposited above the device 100 and the layers may be patterned using known photolithographic and etching techniques. In another illustrative embodiment, a conformal CVD or ALD process may be performed to form a gate insulation layer comprised of, for example, hafnium oxide. Thereafter, one or more metal layers (that will become the gate electrode) and a gate cap layer material (not shown) may be deposited above the device 100. The sidewall spacers 126 and the gate cap layer 124 may be made of a variety of different materials, e.g., silicon nitride, etc. As shown in the plan view (FIG. 3F), after the gate structure 122, spacers 126 and gate cap layer 124 are formed, the layer of insulating material 116 and the epi semiconductor material 120 are exposed in the source/drain regions 128 of the device 100, i.e., in the regions positioned outside of the spacers 126, as reflected in FIG. 3F.

Figure 3I:
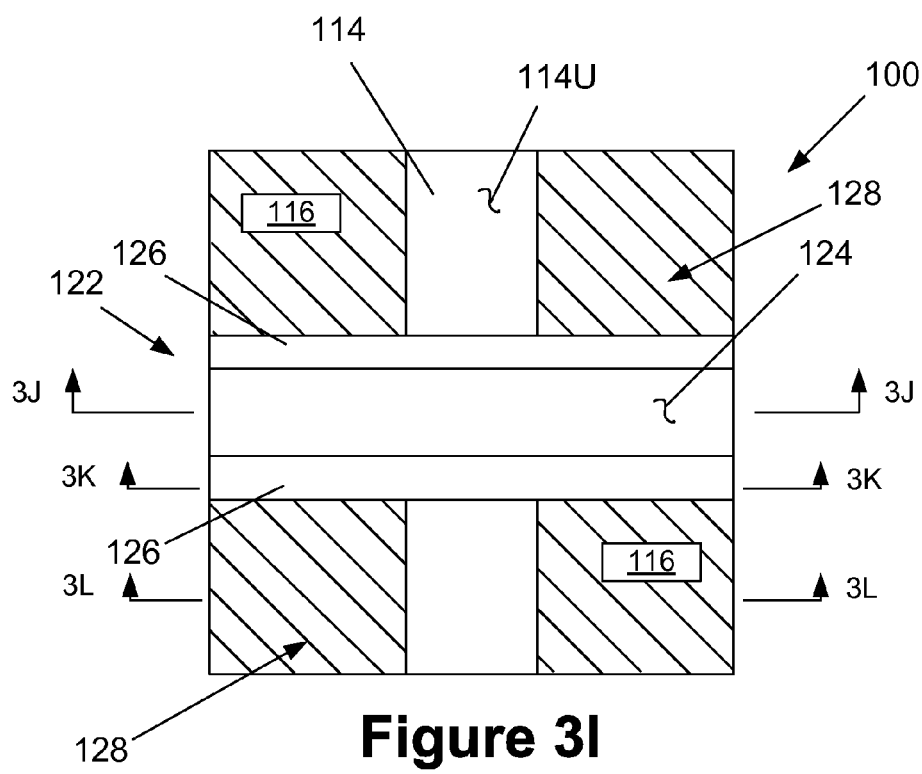
Figure 3J:
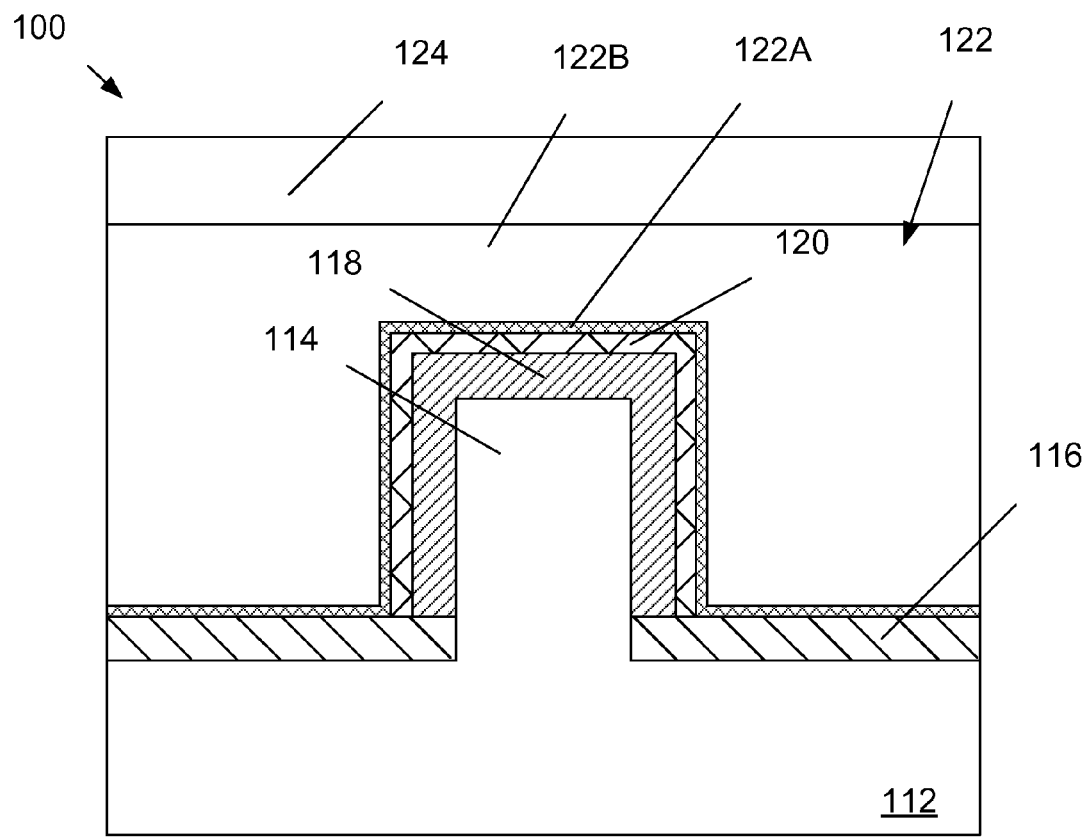
Figure 3K:
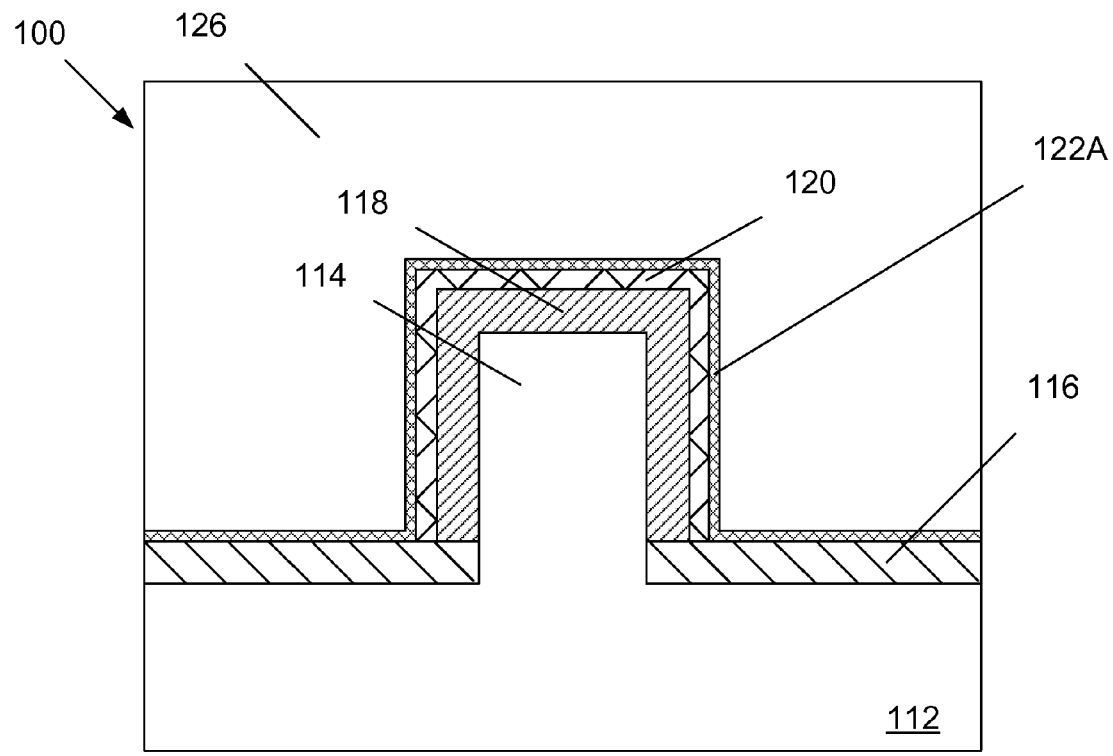
Figure 3L:
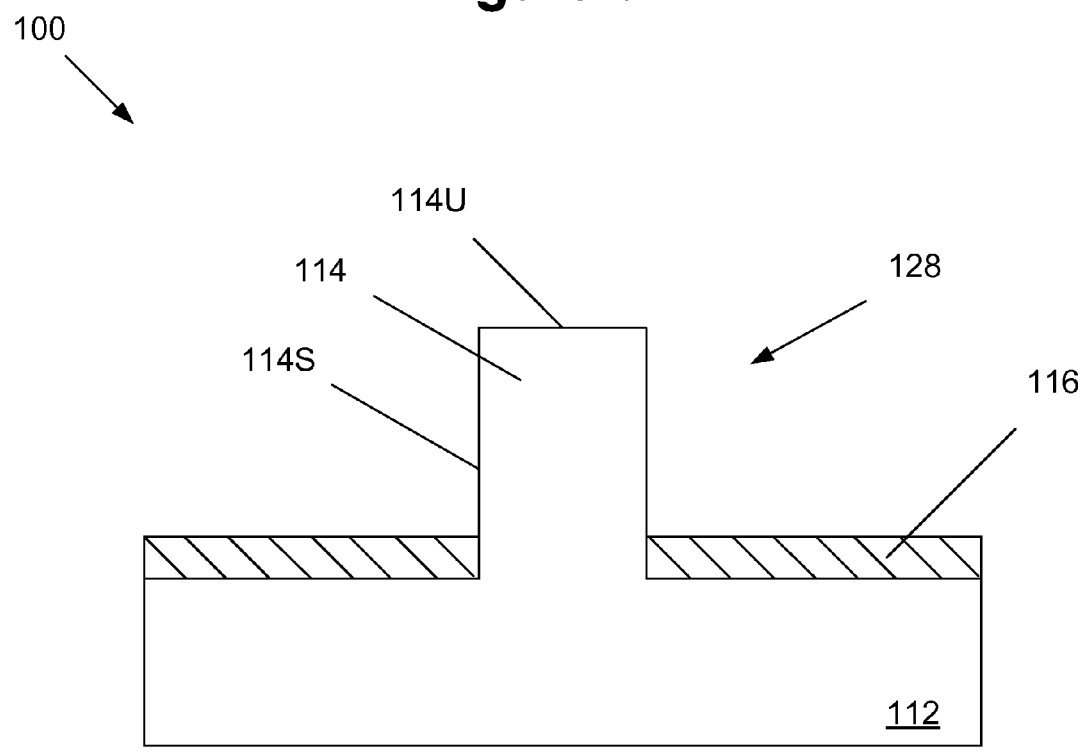

FIG. 3I is a plan view of the device after several process operations were performed to remove the epi semiconductor materials 120, 118 from the source/drain regions 128 of the device 100. The location where various cross-sectional views are taken in subsequent drawings is also depicted in FIG. 3I. Cross-hatching has been maintained in FIG. 3I in an effort to provide clarity. More specifically, a first anisotropic etching process was performed to remove the exposed portions of the second epi material 120, i.e., the portions positioned outside of the spacers 126 selective relative to the surrounding structures (i.e., the gate cap layer 124, the spacers 126, the layer of insulating material 116 and the epi semiconductor material 118). After the exposed portion of the epi semiconductor material 120 was removed, a second anisotropic etching process was performed to remove the exposed portions of epi material 118, i.e., the portions positioned outside of the spacers 126 selective relative to the surrounding structures (i.e., the gate cap layer 124, the spacers 126, the layer of insulating material 116 and fin 114). At the completion of these process operations, as depicted in FIG. 3L, the upper surface 114U and the sidewalls 114S of the fin 114 in the source/drain regions 128 of the device are exposed. Also note that, at the completion of these process operations, the epi semiconductor materials 120, 118 remain positioned under the gate structure 122 and the spacers 126. See FIGS. 3J-3K, respectively.

Figure 3M:
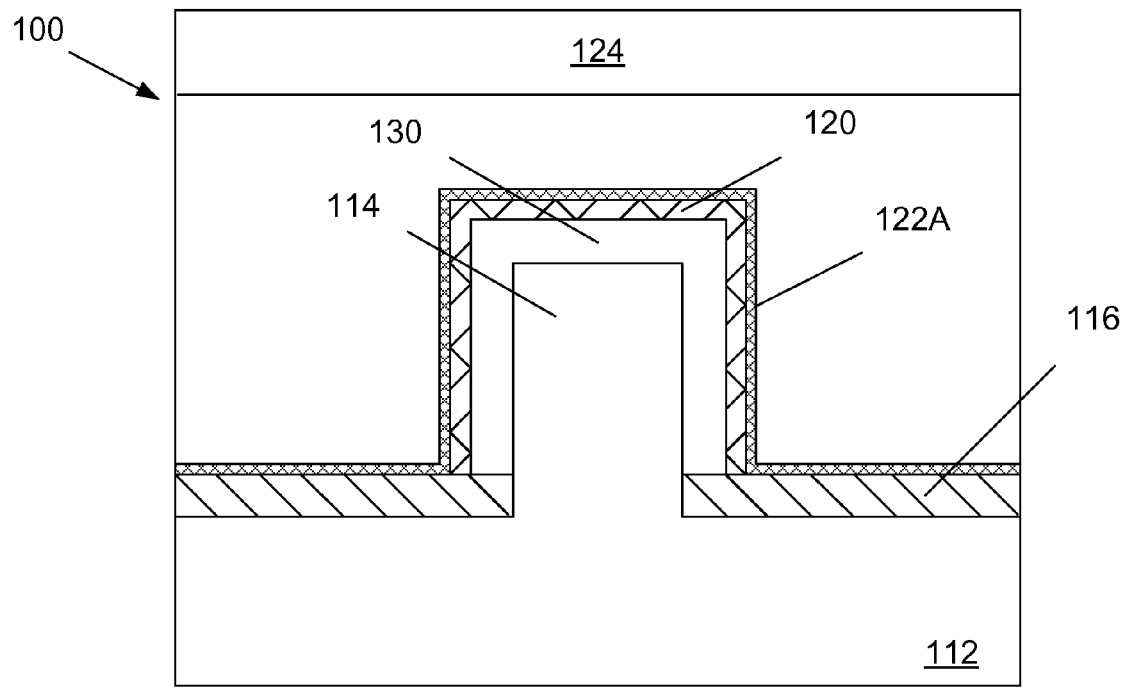
Figure 3N:
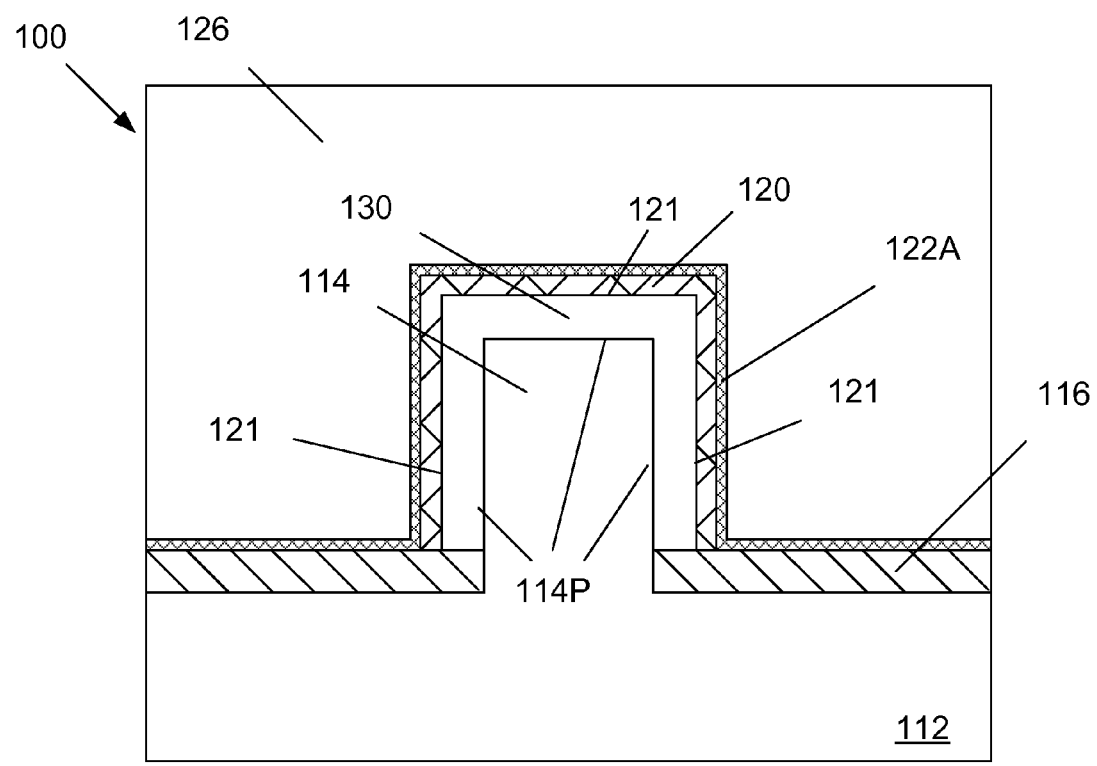

FIG. 3M is a cross-sectional view taken through the channel region of the device 100 in a direction that is transverse to the long axis of the fin 114 (i.e., in the gate-width direction of the device 100 or transverse to the direction of current flow when the device is operational). FIG. 3N is a cross-sectional view taken through the spacer 126 in a direction that is parallel to the gate-width direction of the device 100. As shown in FIGS. 3M-3N, the next process operation involves performing a selective etching process, such as an isotropic wet etching process, to selectively remove the remaining portions of the epi material 118 from under the spacers 126 and the gate structure 122. This results in the formation of a cavity or opening 130 that extends under the spacers 126 and the gate structure 122 across the channel region of the device 100. In this embodiment, the remaining portion of the epi semiconductor material 120 will act as the channel region for the device 100 where current will flow when the device is operational.

With continuing reference to FIGS. 3M-3N, in one embodiment, the cavity 130 may remain substantially unfilled with any material, i.e., an air gap is formed between the epi material 120 and the fins 114 in the area under the spacers 126 and the gate structure 122. In this embodiment, the device 100 may be considered to be an ultra-thin body-on-nothing wherein the cavity 130 remains unfilled. Thus, in this embodiment of the device 100, at the point of processing depicted in FIGS. 3M-3N, traditional manufacturing techniques may be performed to complete the manufacture of the device 100. For example, if desired, additional epi semiconductor material (not shown) may be formed around the fins 114 of the device in the areas laterally outside of the spacers 126, i.e., in the source/drain regions 128 of the device 100. Thereafter, contacts to the source/drain regions 128 and metallization layers may then be formed above the device 100 using traditional techniques.

Figure 3O:
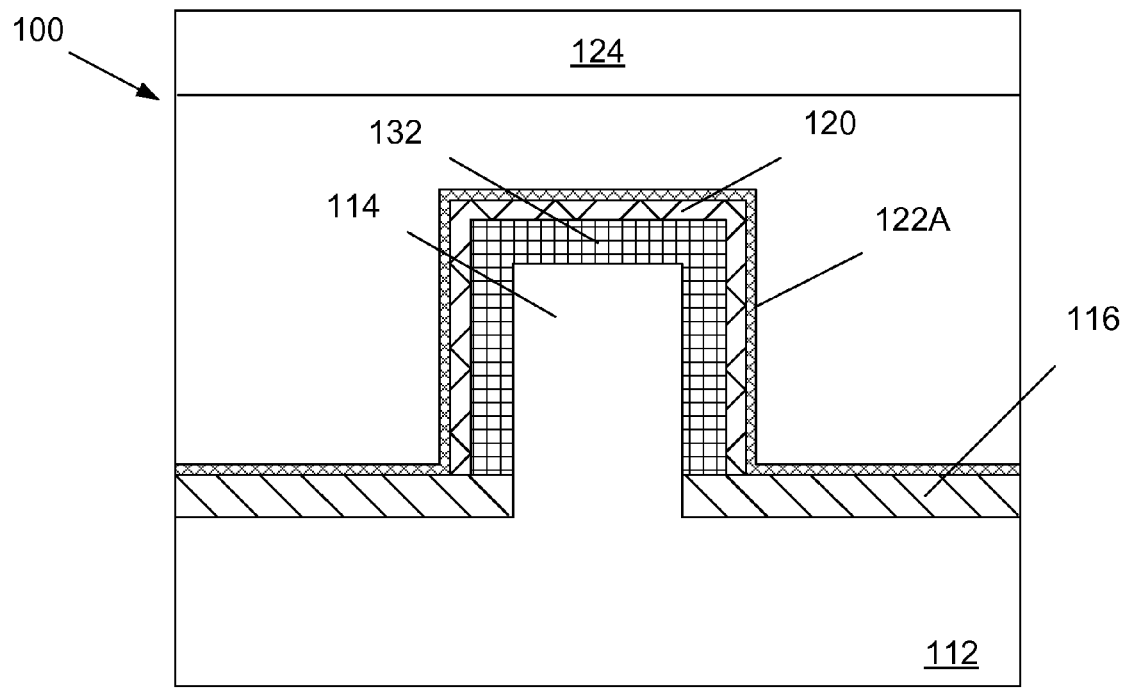
Figure 3P:
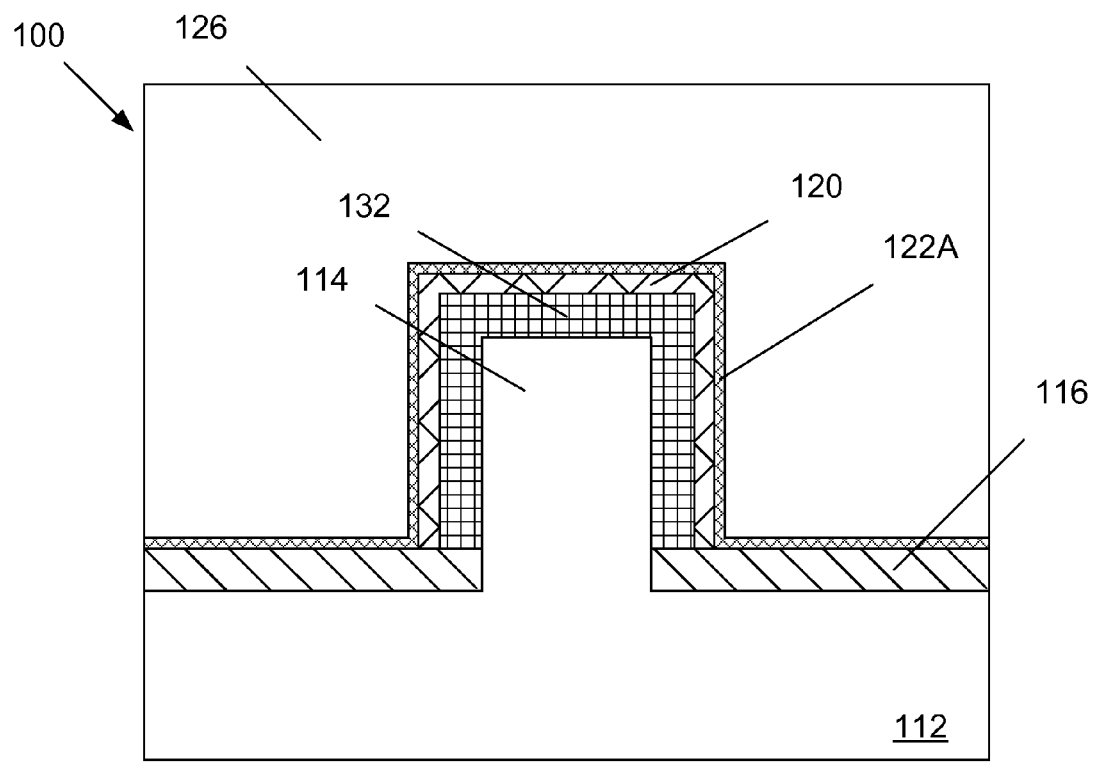

FIG. 3O is a cross-sectional view taken through the channel region of the device 100 in a direction that is transverse to the long axis of the fin 114 (i.e., in the gate-width direction of the device 100 or transverse to the direction of current flow when the device is operational). FIG. 3P is a cross-sectional view taken through the spacer 126 in a direction that is parallel to the gate-width direction of the device 100. FIGS. 3O-3P depict an alternative embodiment of the device 100 disclosed herein. More specifically, in this alternative embodiment, an insulating material 132 is formed in the cavity 130. For example, silicon dioxide or a flowable oxide material may be formed in the cavity 130. In one embodiment, the insulating material 132 may be formed by performing an ALD process operation to deposit the insulating material 132 within the cavity 130 and on the other exposed portions of the device, e.g., the fin in the source/drain region of the device 100. Thereafter, an anisotropic etching process may be performed to remove the portions of the insulating material 132 that are not covered by the spacers 126 and the gate structure 122. In this embodiment, the device 100 may be considered to be an ultra-thin body-on-box (UTBB) wherein the insulating material 132 is a "buried oxide layer." At the point of processing depicted in FIGS. 3O-3P, traditional manufacturing techniques may be performed to complete the manufacture of the device 100. For example, if desired, additional epi semiconductor material (not shown) may be formed around the fins 114 of the device in the areas laterally outside of the spacers 126, i.e., in the source/drain regions 128 of the device 100. Thereafter, contacts to the source/drain regions 128 and metallization layers may then be formed above the device 100 using traditional techniques.

As will be readily apparent to those skilled in the art upon a complete reading of the present application, the present application is directed to various novel methods and devices. For example, one illustrative device 100 disclosed herein includes, among other things, a fin 114 defined in a semiconductor substrate 112, a gate structure 122 positioned around a perimeter surface of the fin, the gate structure comprising a gate insulation layer 122A, a conductive gate material 122B and at least one outermost sidewall spacer 126, the gate structure 122 having an overall width 122W (see FIG. 3F) in a channel length direction of the device 100 that is defined by outer edges of the at least one outermost spacers 126 and a layer of channel semiconductor material 120 (see FIGS. 3M-3N) positioned between the gate structure 122 and around the outer perimeter surface 114P of the fin 114, the layer of channel semiconductor material 120 having an axial length in the channel length direction of the device that corresponds approximately to the overall width 122W of the gate structure 122, wherein an inner surface 121 of the layer of channel semiconductor material 120 is spaced apart from and does not contact the outer perimeter surface 114P of the fin 114.

As will also be readily apparent to those skilled in the art upon a complete reading of the present application, the present application is directed to various illustrative methods of forming the devices disclosed herein. For example, one illustrative method disclosed herein involves, among other things, forming a fin 114 in a semiconductor substrate 112, forming a first layer 118 of semiconductor material on an outer perimeter 114P of the fin, forming a second layer 120 of semiconductor material on the first layer of semiconductor material 118, forming a gate structure 122 comprised of a gate insulation layer 122A, a gate electrode 122B and at least one outermost sidewall spacer 126 around the second semiconductor material 120, wherein the gate structure 122 has an overall width 122W in a channel length direction of the device that is defined by outer edges of the at least one outermost spacer 126, performing at least one etching process to remove the portions of the first and second layers 118, 120 of semiconductor material positioned laterally outside of the at least one sidewall spacer 126 and performing at least one additional etching process to remove the first layer 118 of semiconductor material that is positioned below the gate structure so as to thereby define an empty cavity 130 positioned between an inner surface 121 of the second layer of semiconductor material 120 and an outer perimeter surface 144P of the fin 114, wherein the empty cavity 130 has an axial length in the channel length direction of the device that corresponds approximately to the overall width 122W of the gate structure 122.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a fin defined in a semiconductor substrate;
   a gate structure positioned around an outer perimeter surface of said fin, the gate structure comprising a gate insulation layer, a gate electrode and at least one outermost sidewall spacer, the gate structure having an overall width in a channel length direction of the device that is defined by outer edges of said at least one outermost spacer; and
   a layer of channel semiconductor material positioned between said gate structure and around said outer perimeter surface of said fin without extending beyond said gate structure in said channel direction, wherein an inner surface of said layer of channel semiconductor material is spaced apart from and does not contact said outer perimeter surface of said fin.

2. The device of claim 1, wherein the device further comprises an empty cavity positioned between the inner surface of said layer of channel semiconductor material and said outer perimeter surface of said fin, wherein said empty cavity has an axial length in said channel length direction of the device that corresponds approximately to said overall width of said gate structure without extending beyond said gate structure in said channel length direction.

3. The device of claim 1, wherein the device further comprises a layer of insulating material positioned between the inner surface of said layer of channel semiconductor material and the outer perimeter surface of said fin, wherein the layer of insulating material has an axial length in the channel length direction of the device that corresponds approximately to the overall width of said gate structure.

4. The device of claim 3, wherein said layer of insulating material is comprised of silicon dioxide.

5. The device of claim 2, wherein said layer of channel semiconductor material and said semiconductor substrate are comprised of the same semiconductor material.

6. The device of claim 5, wherein said same semiconductor material is silicon.

7. The device of claim 3, wherein said layer of channel semiconductor material and said semiconductor substrate are comprised of silicon and said layer of insulating material is comprised of silicon dioxide.

8. The device of claim 1, wherein said layer of channel semiconductor material is conductively coupled to a source/drain region of said device.

9. The device of claim 1, wherein said semiconductor substrate is comprised of silicon.

10. A method of forming a device, comprising:
    forming a fin in a semiconductor substrate;
    forming a first layer of semiconductor material on an outer perimeter surface of said fin;
    forming a second layer of semiconductor material on said first layer of semiconductor material;
    forming a gate structure comprised of a gate insulation layer, a gate electrode and at least one outermost sidewall spacer around said second semiconductor material, the gate structure having an overall width in a channel length direction of the device that is defined by outer edges of said at least one outermost spacer;
    performing at least one etching process to remove portions of said first and second layers of semiconductor material positioned laterally outside of said at least one outermost sidewall spacer; and
    performing at least one additional etching process to remove said first layer of semiconductor material that is positioned below said second layer of semiconductor material so as to thereby define an empty cavity positioned between an inner surface of said second layer of semiconductor material and an outer perimeter surface of said fin, wherein the empty cavity has an axial length in the channel length direction of the device that corresponds approximately to the overall width of said gate structure.

11. The method of claim 10, further comprising forming a layer of insulating material within said empty cavity so as to substantially fill the empty cavity with the layer of insulating material.

12. The method of claim 11, wherein forming a layer of insulating material within said empty cavity comprises:
    forming the layer of insulating material in said empty cavity and on exposed portions of said fin positioned laterally outside of said at least one outermost sidewall spacer; and
    performing an anisotropic etching process to remove portions of said layer of insulating material not covered by said gate structure.

13. The method of claim 10, wherein said semiconductor substrate and said second layer of semiconductor material are comprised of silicon and said first layer of semiconductor material is comprised of silicon/germanium.

14. A device, comprising:
    a fin defined in a semiconductor substrate, said fin having a top surface and sidewall surfaces;
    a gate structure positioned around an outer perimeter surface of said fin, said gate structure comprising a gate insulation layer, a gate electrode and at least one outermost sidewall spacer, said gate structure having an overall width in a channel length direction of the device that is defined by outer edges of said at least one outermost spacer; and a layer of channel semiconductor material positioned between said gate structure and around said top surface and at least a portion of said sidewall surfaces of said fin without extending beyond said gate structure in said channel length direction, wherein an inner surface of said layer of channel semiconductor material is spaced apart from and does not contact said outer perimeter surface of said fin.

15. The device of claim 14, wherein the device further comprises an empty cavity positioned between said inner surface of said layer of channel semiconductor material and said outer perimeter surface of said fin, wherein said empty cavity has an axial length in said channel length direction of the device that corresponds approximately to said overall width of said gate structure.

16. The device of claim 14, wherein the device further comprises a layer of insulating material positioned between said inner surface of said layer of channel semiconductor material and said outer perimeter surface of said fin, wherein said layer of insulating material has an axial length in said channel length direction of the device that corresponds approximately to said overall width of said gate structure.

17. The device of claim 16, wherein said layer of insulating material is comprised of silicon dioxide.

18. The device of claim 15, wherein said layer of channel semiconductor material and said semiconductor substrate are comprised of the same semiconductor material.

19. The device of claim 18, wherein said same semiconductor material is silicon.

20. The device of claim 16, wherein said layer of channel semiconductor material and said semiconductor substrate are comprised of silicon and said layer of insulating material is comprised of silicon dioxide.

\* \* \* \* \*